United States Patent
Höller et al.

(10) Patent No.: US 12,235,137 B2
(45) Date of Patent: Feb. 25, 2025

(54) POSITION DETECTION BY AN INDUCTIVE POSITION SENSOR

(71) Applicant: B&R INDUSTRIAL AUTOMATION GMBH, Eggelsberg (AT)

(72) Inventors: Florian Höller, Eggelsberg (AT); Roland Reichhartinger, Eggelsberg (AT)

(73) Assignee: B&R INDUSTRIAL AUTOMATION GMBH, Eggelsberg (AT)

( * ) Notice: Subject to any disclaimer, the term of this patent is extended or adjusted under 35 U.S.C. 154(b) by 175 days.

(21) Appl. No.: 17/841,024

(22) Filed: Jun. 15, 2022

(65) Prior Publication Data

US 2022/0404174 A1    Dec. 22, 2022

(30) Foreign Application Priority Data

Jun. 16, 2021    (AT) ............... A 50484/2021

(51) Int. Cl.
*G01D 5/20* (2006.01)
*G01B 7/00* (2006.01)
*H03M 1/48* (2006.01)

(52) U.S. Cl.
CPC ........... *G01D 5/2066* (2013.01); *G01B 7/003* (2013.01); *H03M 1/485* (2013.01)

(58) Field of Classification Search
CPC .... G01D 5/2066; G01D 5/2073; G01B 7/003; H03M 1/485
See application file for complete search history.

(56) References Cited

U.S. PATENT DOCUMENTS

| | | | |
|---|---|---|---|
| 6,483,295 B2 | 11/2002 | Irle et al. | |
| 7,205,775 B2 | 4/2007 | Kreit | |
| 8,378,692 B2 | 2/2013 | Moenkemoeller | |
| 10,649,015 B1 * | 5/2020 | Arumugam | G01R 27/2605 |

(Continued)

FOREIGN PATENT DOCUMENTS

| | | |
|---|---|---|
| DE | 60 2004 005672 | 12/2007 |
| DE | 10 2007 011064 | 9/2008 |

(Continued)

OTHER PUBLICATIONS

Szymczak et al., "Signalaufbereitung Präzisions-Resolver/Digital-Wandler misst Winkelposition und Drehzahl", Internet link: URL: <https://www.all-electronics.de/elektronik-entwicklung/praezisions-resolverdigital-wandler-misst-winkelposition-und-drehzahl-350.html>, May 28, 2014, pp. 1-23.

(Continued)

*Primary Examiner* — Akm Zakaria
(74) *Attorney, Agent, or Firm* — GREENBLUM & BERNSTEIN, P.L.C.

(57) ABSTRACT

For an easily implementable method for position determination using an inductive position sensor with increased precision of the position information, the position sensor generates a measurement signal from which a frequency functional dependent on the excitation frequency is formed, which represents a measure of the noise signal and the excitation frequency of the excitation signal is changed so that the frequency functional is minimized or maximized and the excitation frequency that minimizes or maximizes the frequency functional is used for the excitation signal.

13 Claims, 4 Drawing Sheets

(56) References Cited

U.S. PATENT DOCUMENTS

| | | | |
|---|---|---|---|
| 2005/0253576 A1 | 11/2005 | Nyce | |
| 2006/0244464 A1* | 11/2006 | Kreit | G01D 5/2073 324/654 |
| 2010/0033193 A1* | 2/2010 | Moenkemoeller | G01D 5/2073 324/612 |
| 2013/0121448 A1* | 5/2013 | Hui | H04B 1/1027 375/346 |

FOREIGN PATENT DOCUMENTS

| | | |
|---|---|---|
| EP | 1 158 276 | 11/2001 |
| EP | 2 533 019 | 12/2012 |

OTHER PUBLICATIONS

Guo et al., "Noise Reduction for High-Accuracy Automatic Calibration of Resolver Signals via DWT-SVD Based Filter", Electronics 8, No. 5: 516, Internet link: URL:<https://doi.org/10.3390/electronics8050516>.

Austria Search Report conducted in counterpart Austria Appln. No. A 50484/2021 (Jun. 16, 2021).

Europe Search Report/Office Action conducted in counterpart Europe Appln. No. EP 22 17 8793 (Nov. 7, 2022).

* cited by examiner

POSITION DETECTION BY AN INDUCTIVE POSITION SENSOR

CROSS-REFERENCE TO RELATED APPLICATION

This application claims priority under 35 U.S.C. § 119(a) to Austria Application No. A50484/2021 filed Jun. 16, 2021, the disclosure of which is expressly incorporated by reference herein in its entirety.

BACKGROUND

1. Field of the Invention

Embodiments relate to a method for determining the position of a moving part relative to a stationary part by an inductive position sensor. An excitation winding is arranged on the moving part and at least one secondary winding is arranged on the stationary part, or vice versa, and an excitation signal with an excitation frequency and an excitation amplitude is fed into the excitation winding, which generates an electromagnetic excitation field that induces a measurement signal in the secondary winding, which is detected, and a noise signal is superimposed on the measurement signal. Embodiments also relate to an evaluation unit for an inductive position sensor with such a method for determining the position.

2. Discussion of Background Information

A resolver is a rotary position sensor that works inductively and is robust and inexpensive, which is why a resolver is used in a variety of ways. A resolver allows the angular position of a rotor of the resolver to be detected. If the rotor of the resolver is connected to a machine shaft, the angular position of the shaft can be detected. An example of a typical application of a resolver is in an electric motor to obtain position information of the motor shaft. The combination of an electric motor and a resolver is often also referred to as a servo motor. The position information can then be used to control, for example by means of a position or velocity control, of a servo drive consisting of the servo motor and a load driven thereby.

In a resolver, there is an excitation winding which rotates with the rotor of the resolver and at least two secondary windings which are stationary relative to the excitation winding. A high-frequency excitation signal, typically in the frequency range of 1 kHz to 10 kHz, is applied to the excitation winding. The voltages measured in the secondary windings and induced due to the rotating magnetic field of the excitation winding pulsate at the same frequency as the excitation signal, but their amplitudes depend on the position of the excitation winding relative to the respective secondary winding. These voltages are output as measurement signals by the resolver and are evaluated in a downstream evaluation unit in order to determine the angular position. This is an amplitude modulation of the measurement signal. The secondary windings are usually arranged at 90° to one another, so that the measured voltages are 90° out of phase. Of course, other angles are also possible. The amplitudes of the measured voltages thus proceed as a sine function depending on the position of the excitation winding to the secondary winding, or as a cosine function for the secondary winding offset by 90°, or generally as a sine function with a specific phase offset. The evaluation of both measurement signals, for example by means of the arctangent function (usually the arctan 2 function), allows an unambiguous calculation of the current angular position of the rotor of the resolver.

The actual position information is therefore in the envelope of the measurement signal, which is extracted from the measurement signals. The envelope corresponds to the sine function (or cosine function) of the measured voltage, with the period duration corresponding to one revolution of the rotor and the period duration thus being dependent on the angular velocity of the rotor. A common procedure for evaluation is always sampling the measurement signals with an electronic evaluation system with an analog-digital converter exactly when the excitation signal reaches a maximum. Since the excitation signal is usually also formed in the electronic evaluation system, the required sampling times are known exactly, or alternatively can also be determined easily. The electronic evaluation system thus only detects the peak values of the measurement signals and in this way eliminates the higher-frequency excitation signal. What remains are sinusoidal or cosinusoidal signal curves with a period that corresponds to one revolution of the rotor, which signal curves contain the actual position information and are evaluated, for example by means of arctangent.

The excitation signal of the resolver, in particular its amplitude and frequency, is usually specified in advance, for example on the basis of the resolver's data sheet. The excitation signal is usually not changed during operation of the resolver after setting.

In real implementations, however, there is always noise in the measurement signal output by the resolver, for example due to stochastic component noise or systematic noise. The stochastic noise is usually caused by thermal noise and shot noise of the components in the electronic evaluation system and can be modeled as white noise. The systematic noise can result from the application of the resolver. In the case of servo drives, converters or inverters are often used in which semiconductor switches are switched at high frequency. This can lead to high-frequency coupling to the measurement signal. Inductive crosstalk of the motor currents in a servo drive or other electrical currents in the vicinity of the resolver are also conceivable. Such sources of interference can significantly limit the precision of the position information that can be obtained from the resolver. Precision is also understood to mean the achievable temporal resolution of the position information obtained. This means in particular that in one revolution of the rotor of the resolver, the position information may not be obtained with the desired temporal resolution due to interference in the measurement signal because no position information can be determined at certain points in time due to the noise.

Consequential problems then arise with a limited precision of the position information. For example, in a servo drive, the position information is used to control the servo drive. The position information is used for this purpose as the actual value of the control. The more imprecise the actual value, the more robust the control must be, which is usually associated with reduced control dynamics. This means that the servo drive is less able or slower to follow dynamic setpoints (in the sense of setpoint progressions over time with large rates of change over time, i.e. large changes in the setpoint in short time intervals). The control behavior of the servo drive thus deteriorates and the control dynamics are restricted.

As explained, the useful signal in the measurement signal, the amplitude-modulated sinusoidal oscillation, is unavoidably embedded in a noise signal. In order to obtain position information, the useful signal must be able to be extracted from the measurement signal. In order to achieve this, it is necessary for the useful signal to stand out clearly from the background noise (noise signal). In this context, the signal-to-noise ratio, abbreviated as SNR, was introduced. The SNR is a measure of the quality of a useful signal that is embedded in a noise signal. The SNR is generally defined as the ratio of the mean power of the useful signal to the mean noise power of the noise signal. The higher the SNR, the better the useful signal can be extracted from the noisy measurement signal. If the SNR is too low, the useful signal can no longer be extracted or only insufficiently or with a lower temporal resolution.

In order to ensure a sufficiently high SNR, the amplitude of the excitation signal has hitherto been selected to be sufficiently large. Of course, it is inadvisable to choose an amplitude that is too large either, as this can lead to thermal problems in the resolver, but which would also increase the demands on the electronic evaluation system. In addition, a high amplitude excitation signal also puts a higher demand on the generation of the excitation signal.

Methods for noise-optimized evaluation of the measurement signals from the resolver are therefore already known in the prior art. An example of this is Guo M. et al., "*Noise Reduction for High-Accuracy Automatic Calibration of Resolver Signals via DWT-SVD Based Filter*", Electronics 2019, 8(5):516. Herein, the envelope of the measurement signal is subjected to a discrete wavelet transformation in order to filter out the noise. This method is computationally expensive, which is disadvantageous for many applications. Despite the noise-optimized evaluation, a certain SNR must of course also be present with this method in order to allow an evaluation at all.

It has been shown in practice that narrow-band (related to the frequency content) sources of interference in particular, which are caused for example by inductive or capacitive coupling, can be problematic because the SNR can become very low in these frequency ranges. However, such sources of interference are not known in advance. The achievable precision of the determined position information can thus decrease. This occurs in particular in systems where the resolver and the electronic evaluation system are locally separate and are connected to one another, for example by a cable. Due to the transmission of the measurement signals via the cable, such systems are particularly susceptible to interference, because interference signals from a wide variety of interference sources can be coupled into the cable.

However, the problems described above do not only occur in resolvers, but can in principle occur in all inductive position sensors having an excitation winding and at least one secondary winding in which the measurement signal is induced due to the excitation field of the excitation winding. The excitation winding and the secondary winding can be moved relative to one another, so that the measurement signal is position-dependent.

SUMMARY

Embodiments are directed to an easily implementable method with increased precision of the position information of an inductive position sensor.

In embodiments, a frequency functional is formed from the measurement signal, which is dependent on the excitation frequency and which represents a measure of the noise signal. The excitation frequency of the excitation signal is changed so that the frequency functional is minimized or maximized and the excitation frequency that minimizes or maximizes the frequency functional is used for the excitation signal. By changing the excitation frequency, it can be achieved in particular that the excitation takes place in a frequency range in which the noise signal is as weak as possible. The useful signal in this frequency range is thus disturbed as little as possible by the noise signal and the useful signal can be extracted optimally because the signal-to-noise ratio is high in this frequency range. The excitation signal of the inductive position sensor can thus be optimally adapted to a specific application and the precision of the position information can be improved.

Advantageously, an amplitude of the measurement signal with regard to a deviation from the expected signal curve of the measurement signal is examined with the frequency functional, since the noise signal is immediately noticeable in the amplitude. This can be achieved in that amplitude information of the amplitude of the measurement signal is derived from the measurement signal and the frequency functional is a function of the amplitude information.

The measurement signal is particularly advantageously demodulated in order to determine the amplitude information. Since the measurement signal is an amplitude-modulated signal, the amplitude information can be obtained in a simple manner by means of demodulation. Known methods such as the IQ method can be used for this purpose.

With the IQ method, the I component, which represents the amplitude of the measurement signal, and the Q component, which represents the phase of the measurement signal, are determined. In this case, it is advantageous if a phase shift of the excitation signal is set so that the I component of the measurement signal is at a maximum and the Q component disappears.

For the implementation of position detection, it is advantageous if a statistical variance of the amplitude information is used as the frequency functional. This can be realized particularly advantageously in digital implementation if the statistical variance is determined as the expected square deviation of the value of the amplitude information from the expected value of the amplitude information, wherein an arithmetic mean of the amplitude information is preferably used as the expected value. A short-term variance over a plurality of sampled amplitude values can be used as the variance.

Embodiments are directed to a method for determining the position of a moving part relative to a stationary part by an inductive position sensor, wherein an excitation winding is arranged on one of the moving part or the stationary part and at least one secondary winding is arranged on the other of the moving part or the stationary part. The method includes feeding an electrical excitation signal with an excitation frequency and an excitation amplitude into the excitation winding, which generates an electromagnetic excitation field; detecting a measurement signal induced in the secondary winding by the generated electromagnetic excitation field, wherein the measurement signal includes a superimposed noise signal, forming a frequency functional which is dependent on the excitation frequency and represents a measure of the noise signal on the measurement signal, and changing the excitation frequency of the excitation signal so that the frequency functional is minimized or maximized and using the changed excitation frequency that minimizes or maximizes the frequency functional for the excitation signal. The position of the moving part of the position sensor is determined from the measurement signal.

According to embodiments, the frequency functional can be used to examine an amplitude of the measurement signal with regard to a deviation from an expected signal curve of the measurement signal.

In accordance with embodiments, an amplitude information of the amplitude of the measurement signal may be derived from the measurement signal and the frequency functional is a function of the amplitude information. The measurement signal can be demodulated in order to determine the amplitude information. The measurement signal may be demodulated with the excitation oscillation of the excitation signal in order to determine the amplitude information. Further, the measurement signal can be demodulated with the excitation oscillation of the excitation signal in order to determine an I component of the measurement signal representing the amplitude. The measurement signal may be demodulated with the 90° out-of-phase excitation oscillation of the excitation signal, in order to determine a Q component of the measurement signal representing the phase. Moreover, a statistical variance of the amplitude information can be used as the frequency functional. The statistical variance may be determined as the expected square deviation of the value of the amplitude information from the expected value of the amplitude information, wherein an arithmetic mean of the amplitude information is preferably used as the expected value. Still further, a phase shift of the excitation signal can be set so that the I components of the measurement signal are at a maximum.

In still yet other embodiments, the excitation amplitude may be regulated to a predetermined amplitude setpoint.

Embodiments are directed to an evaluation unit for an inductive position sensor having a moving part with one of an excitation winding or at least one secondary winding and a stationary part having the other of the one of an excitation winding or at least one secondary winding, in which an electrical excitation signal with an excitation frequency and an excitation amplitude is fed into the excitation winding, which generates an electromagnetic excitation field that induces a measurement signal in the secondary winding which is fed to the evaluation unit with a superimposed noise signal on the measurement signal. The evaluation unit, which determines a position of the moving part relative to the stationary part of the position sensor from the measurement signal, includes at least one memory and at least one processor configured to execute at least one set of instructions stored in the at least one memory to: form a frequency functional, which is dependent on the excitation frequency and represents a measure of the noise signal, from the measurement signal, and determine the excitation frequency of the excitation signal which minimizes or maximizes the frequency functional and the excitation frequency which minimizes or maximizes the frequency functional is used when using the evaluation unit for the excitation signal.

Other exemplary embodiments and advantages of the present invention may be ascertained by reviewing the present disclosure and the accompanying drawing.

BRIEF DESCRIPTION OF THE DRAWINGS

The present invention is described in greater detail in the following with reference to FIG. 1 to 7, which show advantageous embodiments of the invention by way of example, schematically, and in a non-limiting manner. In the drawings.

DETAILED DESCRIPTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
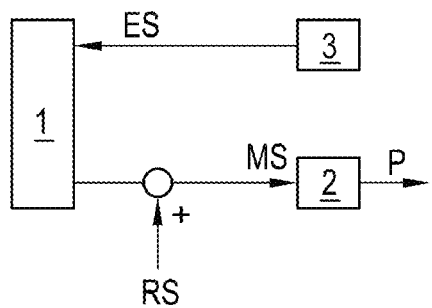
FIG. 1 and FIG. 2 show the measuring principle of a resolver as an inductive position sensor.
Figure 2:
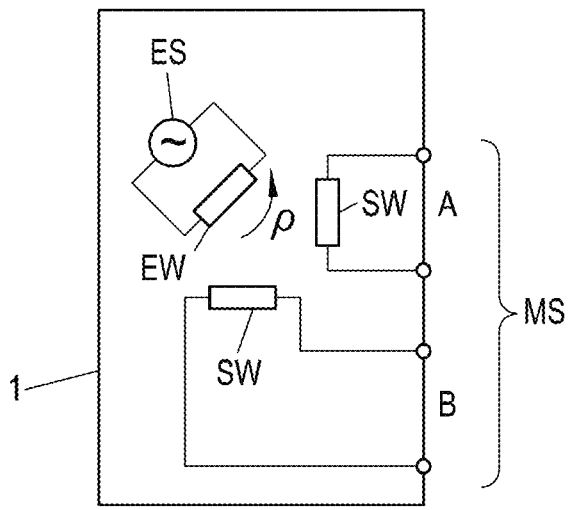

FIGS. 1 and 2 show the principle of an inductive position sensor 1 using the example of a conventional resolver. The resolver comprises an excitation winding EW, which is excited with an excitation signal ES. The excitation signal ES is generated with a generating unit 3, for example an electrical or electronic circuit. The excitation signal ES is an electrical alternating signal with a specific excitation amplitude R0 and excitation frequency $\omega$, i.e., for example ES=R0·cos($\omega$t), where t denotes the time. If the excitation winding EW moves relative to a secondary winding SW, an electrical voltage is induced in the secondary winding SW which is dependent on the position P (in this example the angle $\rho$) of the secondary winding SW relative to the excitation winding EW. In a resolver, for example, two secondary windings SW are arranged offset from one another by 90° (FIG. 2) and the excitation winding EW rotates in the resolver. However, only one secondary winding SW would be sufficient. In the case of a linear inductive position sensor 1, a linear relative movement would be provided between the excitation winding EW and the secondary winding SW, it also being possible for a plurality of secondary windings to be arranged one behind the other in the direction of movement. The voltage induced in the at least one secondary winding SW is output as a measurement signal MS of the inductive position sensor 1 and can be evaluated in an evaluation unit 2 in order to determine a position P of the moving part of the inductive position sensor 1, usually the excitation winding EW.

In the case of a resolver having two secondary windings SW, the measurement signal MS comprises two measurement signal tracks A, B. Due to the offset arrangement of the secondary windings SW, the measurement signal tracks A, B have a specific phase offset.

The excitation winding EW is arranged in an inductive position sensor 1 on a moving part, for example on a motor shaft of an electric motor, and the at least one secondary winding SW is on a stationary part, for example on a housing of the position sensor 1, which in turn can be arranged on a motor housing. However, this arrangement can also be reversed. The moving part and the stationary part are arranged to be movable relative to one another.

With a resolver as the inductive position sensor 1 and an excitation signal ES=R0·cos($\varphi$), with $\varphi$=$\omega$t, and a 90° offset arrangement of the secondary windings SW, the measurement signal tracks A, B in the measurement signal MS result in, for example $A = R0 \cdot u \cdot \cos(\rho) \cdot \cos(\varphi - \Delta\varphi)$ $B = R0 \cdot u \cdot \sin(\rho) \cdot \cos(\varphi - \Delta\varphi)$ Herein, u denotes a known transfer ratio of the inductive position sensor 1 and Δφ denotes a delay which results substantially from a propagation time of the inductive position sensor 1 and the processing of the measurement signal MS in the evaluation unit 2 (e.g. by filters and the like). The delay Δφ follows as Δφ=ωΔt+φ$_V$, with a delay φ$_V$ resulting from the processing, and the propagation time Δt. ρ denotes the angular position of the excitation winding EW relative to the secondary windings SW (indicated in FIG. 2) and thus the position P of actual interest.

In other arrangements of an inductive position sensor 1, the measurement signal MS can of course also be different, also with more or fewer measurement signal tracks, but the measurement signal MS is always dependent on the position P, i.e. MS(P). The measurement signal MS comprises at least one measurement signal track A, B.

Figure 3:
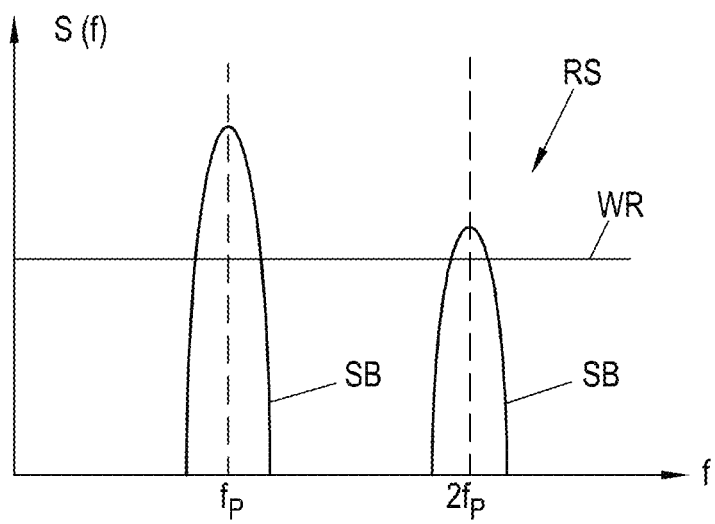
FIG. 3 shows a frequency spectrum of a noise signal.

This principle of an inductive position sensor 1 is well known. It is also known that a noise signal RS is usually superimposed on the measurement signal MS, as indicated in FIG. 1. The noise signal RS is usually not known and can comprise different frequency bands. The noise signal RS can be white noise WR, for example, which also comprises narrow interference bands SB in specific frequency ranges. This is shown as an example in FIG. 3 by a frequency spectrum S(f) (frequency f) of the noise signal RS. These narrow-band interference bands SB around characteristic frequencies f$_P$, 2f$_P$ can be coupled into the measurement signal MS from the environment (e.g. inductively). Of course, the noise signal RS can also have a different frequency spectrum S(f). The noise signal RS largely determines the signal-to-noise ratio of the measurement signal MS. In order to be able to extract the useful signal from the measurement signal MS (e.g. the measurement signal tracks A, B), the greatest possible signal-to-noise ratio is advantageous, i.e. a large distance between the actual useful signal in the measurement signal MS and the noise signal RS.

The basic idea of the invention is to use a frequency functional F$_f$ that is dependent on the excitation frequency ω as a measure of the noise signal RS in the measurement signal MS and to change the excitation frequency ω so that the frequency functional F$_f$ is optimized, which, depending on the formulation of the frequency functional F$_f$, corresponds to a maximization or minimization. The excitation frequency ω, which minimizes or maximizes the frequency functional F$_f$, is then used in the excitation signal ES for the operation of the inductive position sensor 1.

The frequency functional F$_f$ as a measure of the noise signal RS in the measurement signal MS thus makes it possible to obtain information on the noise signal RS in the measurement signal MS. The measure is, for example, a variable that compares the noise signal RS with the measurement signal MS or places the noise signal RS in relation to the measurement signal MS. The frequency functional F$_f$ can be formulated mathematically as a mathematical function of the excitation frequency ω.

The frequency functional F$_f$ can of course be formulated in a wide variety of ways, for example as a signal-to-noise ratio if the noise signal RS can be separated from the measurement signal MS, for example by filtering. A frequency functional F$_f$ can also be used to examine the amplitude of the measurement signal MS (specifically at least one measurement signal track) with regard to a deviation from the expected signal curve of the measurement signal MS. This deviation is a measure of the noise signal RS. In the case of the resolver, for example, this would be a modulated sine wave, with noise being noticeable as a deviation from this modulated sine wave. For this purpose, for example, a statistical variance of the amplitude of the measurement signal could be used as a frequency functional F$_f$ as a measure of this deviation, and thus as a measure of the noise signal RS. For this purpose, amplitude information FA of the amplitude of the measurement signal MS can be derived from the measurement signal MS, or from at least one measurement signal track of the measurement signal MS, which is then evaluated in the frequency functional F$_f$. The amplitude information FA can be dependent on the excitation frequency ω. The frequency functional F$_f$ is therefore a function of the amplitude information FA, i.e. F$_f$(FA(ω)), and is therefore dependent on the excitation frequency ω.

A particularly advantageous embodiment of the invention is explained with reference to FIG. 4. In this method, the at least one measurement signal track A, B is demodulated in order to obtain the useful signal, i.e. the variable that oscillates as a function of the position P, for example cos(ρ) or sin(ρ). The amplitude information FA of the measurement signal MS can be obtained from such a demodulation, from which a frequency functional F$_f$ can then be formed as described above. Since the excitation signal ES and the measurement signal MS usually have a phase shift due to a time delay Δφ, the well-known IQ method (in-phase & quadrature method) is suitable for demodulation, since it can be used to obtain both the amplitude information and the phase information. For demodulation, the measurement signal MS is multiplied by the excitation oscillation cos(ωt) in order to obtain the I component that represents the amplitude. If the measurement signal MS is optionally also multiplied by the excitation oscillation that is 90° out of phase, the phase information (Q component) is also obtained. In the case of a resolver, this can be expressed mathematically in the form of the periodic scalar products, with at least one measurement signal track A, B generally being present.

$$A_I = (A|\cos(\varphi)) = \frac{1}{2}R0 \cdot u \cdot \cos(\rho) \cdot \cos(\Delta\varphi)$$

$$B_I = (B|\cos(\varphi)) = \frac{1}{2}R0 \cdot u \cdot \sin(\rho) \cdot \cos(\Delta\varphi)$$

And optionally or as needed $$A_Q = (A|\sin(\varphi)) = \frac{1}{2}R0 \cdot u \cdot \cos(\rho) \cdot \sin(\Delta\varphi)$$

$$B_Q = (B|\sin(\varphi)) = \frac{1}{2}R0 \cdot u \cdot \sin(\rho) \cdot \sin(\Delta\varphi)$$

The I component A$_I$, B$_I$ contains the amplitude information FA and can also be squared for further use FA=A$_I^2$, or alternatively the absolute value FA=|A$_I$| could also be used. If there is a plurality of measurement signal tracks A, B, the sum of the squares FA=A$_I^2$+B$_I^2$ of the I components A$_I$, B$_I$ or, alternatively, the sum of the absolute values FA=|A$_I$|+|B$_I$| can also be used. In principle, other arithmetic combinations of the I components are also conceivable.

A statistical variance V of the amplitude information FA, for example, which is dependent on the excitation frequency ω, can then be used as the frequency functional F$_f$. The variance V can be specified as the expected quadratic deviation (i.e. the expected value E) of the value of the amplitude information FA from its expected value E(FA). The arithmetic mean can be used as the expected value E(FA). This can be expressed mathematically in the form $$F_f = V(FA) = E((FA - E(FA))^2).$$

A plurality N of values of the amplitude information FA are preferably used to determine the variance V, which can be obtained by sampling the measurement signal MS with a predetermined sampling frequency (e.g. in the megahertz range). With a typical excitation frequency of 10 kHz, a sampling frequency of 1 MHz would result in a hundredfold oversampling. The variance V can thus be expressed as a short-term variance in the form $$F_f = V(FA) \approx \frac{1}{N-1} \sum_{i=0}^{N-1} \left( FA_i - \frac{1}{N} \sum_{i=0}^{N-1} FA_i \right)^2.$$

For example, 1,000 to 10,000 periods of the excitation signal ES are used for the determination, which would lead to an observation period for determining a value of the variance V of 100 ms to 1 s.

The frequency functional $F_f$ is now optimized with regard to the excitation frequency $\omega$, which can be expressed mathematically by $$\omega = \min_{\omega}(F_f) \text{ or } \omega = \max_{\omega}(F_j).$$

The excitation frequency $\omega$ is thus varied until the functional $F_f$ is optimized (in the sense of a minimum or maximum). The excitation frequency $\omega$ is varied within a specified frequency range.

In order to solve such optimization problems, there is a wealth of known solution algorithms, such as the gradient method, the Newton method, evolutionary methods or sequential quadratic programming, to name just a few. However, the choice of the solution algorithm is irrelevant for the invention, although it is of course advisable to choose a method that is advantageous in terms of computing effort and computing time. What the solution methods have in common is that possible solutions to the optimization problem are sought, usually iteratively, until a defined termination criterion is reached. The termination criterion can be, for example, a number of iterations, or the difference between the solutions of two successive iteration steps of the optimization problem falling below a limit value, or another termination criterion. The solution (i.e. excitation frequencies $\omega$) in each iteration step is selected using the specified rules of the solution method, wherein a suitable choice of the solution can be specified as the starting value in the first iteration step. In the gradient method, for example, the gradient of the functional is determined (derivation of the functional with respect to the excitation frequency) and the manipulated variable for the next iteration step is selected along this gradient, with the increment from the current manipulated variable to the next manipulated variable being determined by the specified rules of the solution method.

In this way, the excitation frequency $\omega$ can be determined, with which the inductive position sensor 1 must be excited so that the influence of the noise signal RS is minimal. Narrow-band interference bands in particular can be avoided in this way. If the excitation frequency $\omega$ were selected, for example, in the range of the frequency $f_P$ (or an integral multiple thereof) (FIG. 3), then the signal-to-noise ratio of the measurement signal MS would drop compared to an excitation frequency $\omega$ away therefrom.

A possible implementation of a frequency tuning according to the invention as described above is shown in FIG. 4.

The example again relates to a resolver with at least one measurement signal track A in the measurement signal MS.

The measurement signal track A is first demodulated and the I component $A_I$ is determined, which is squared in order to determine the amplitude information FA. This can be carried out in a frequency tuner FT. A second measuring signal track B, as is usual with resolvers, is indicated by dashed lines in FIG. 4. In this example, the amplitude information FA would then be the sum of the squared I components $A_I$, $B_I$ of the measurement signal tracks A, B. The variance V(FA) of the amplitude information FA is used as the frequency functional $F_f$, for example as a short-term variance as described above. The frequency functional $F_f$ is minimized with regard to the excitation frequency $\omega$ and the inductive position sensor 1 is then operated with this excitation frequency $\omega$. This ensures the greatest possible signal-to-noise ratio in the respective application with the prevailing interference environment.

Figure 4:
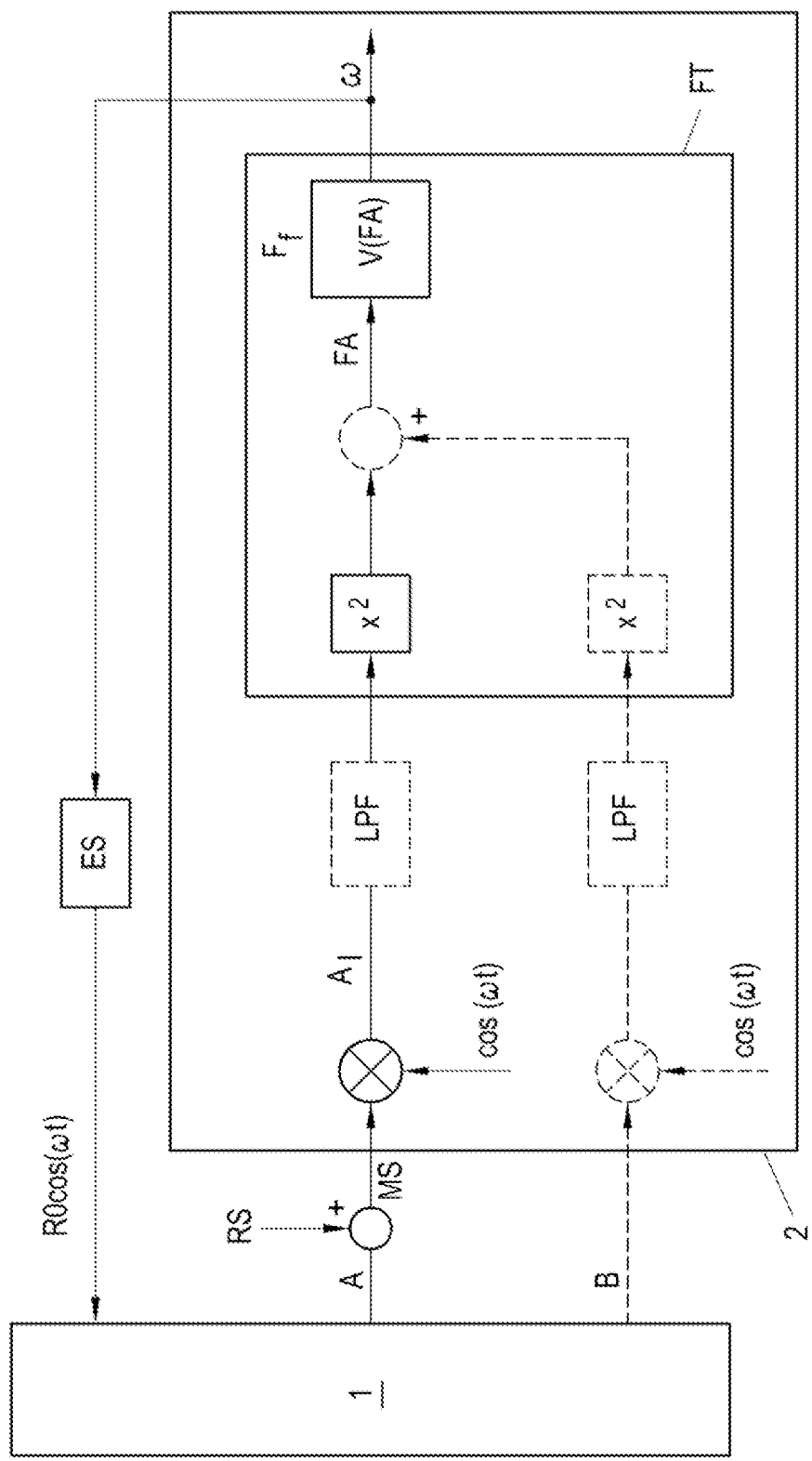
FIG. 4 shows frequency tuning of the excitation frequency of the excitation signal according to the invention.

Low-pass filters LPF are also indicated in FIG. 4 after the determination of the I components $A_I$, $B_I$. Such a low-pass filter LPF could be used in order to suppress the double excitation frequencies $\omega$ that result during demodulation.

This frequency tuning could be carried out once when the inductive position sensor 1 is put into operation and the excitation frequency $\omega$ could then be left the same, assuming an unchanging interference environment. It would only have to be ensured that the sources of interference in the environment are active during the frequency tuning.

However, the frequency tuning could also be carried out continuously during operation of the inductive position sensor 1, for example at predetermined time intervals.

Ongoing frequency tuning could, for example, function in such a way that an ongoing spectral analysis of the at least one measurement signal track A, B is carried out, for example by means of an FFT (fast Fourier transformation) and the noise power density of the noise signal RS is quantified in the frequency spectrum as a frequency functional $F_f$. The minimum of the noise power density can be identified and the excitation frequency W can then be set at the point with the minimum noise power density.

The frequency tuning according to the invention could also be combined with phase tuning. It can thus be achieved that the I components $A_I$, $B_I$ of the demodulated measurement signal tracks A, B are at a maximum (which is advantageous for the frequency tuning) and that the Q components $A_Q$, $B_Q$ disappear. This can be carried out, for example, with a phase controller $R_\varphi$ that controls a phase shift $\Delta\varphi$ of the excitation signal ES, so that the Q components $A_Q$, $B_Q$ disappear.

This can be implemented with a resolver, for example, by using a phase functional $F_\varphi = A_I A_Q + B_I B_Q$, again using the scalar products.

This phase functional $F_\varphi$ is independent of the position $\rho$ and results in $$F_\varphi = \frac{1}{8} R0^2 u^2 \sin(2\Delta\varphi).$$

This function has four zero points in the interval $\Delta\varphi \in [0, 2\pi]$, in two of which (at $\pi/2$, $3\pi/2$) the I components $A_I$, $B_I$ disappear and the Q components $A_Q$, $B_Q$ are at a maximum and in the other two zeros (at 0, $\pi$) the Q components $A_Q$, $B_Q$ disappear and the I components $A_I$, $B_I$ are at a maximum.

A phase controller $R_\varphi$ can now control the phase functional $F_\varphi$ to zero, i.e. $F_\varphi=0$, with the phase controller $R_\varphi$ ensuring that the phase shift Δφ locks at 0 or π. The phase controller $R_φ$ can be designed, for example, as a known I controller (integral controller).

Figure 5:
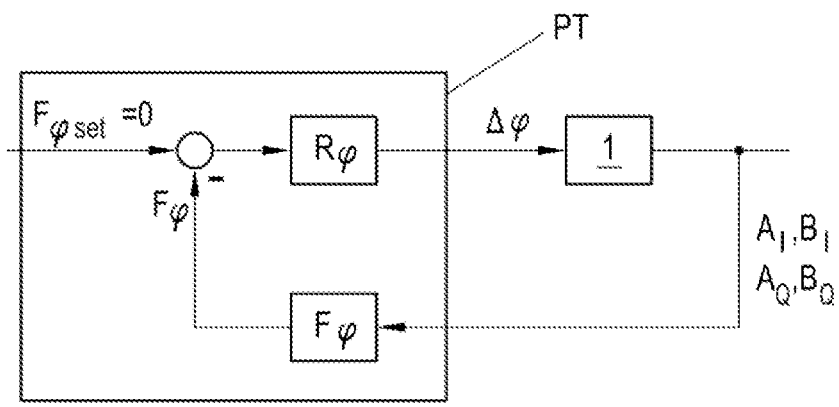
FIG. 5 shows phase tuning according to the invention.

The phase tuner PT can be implemented as shown in FIG. 5. The phase setpoint $F_{φset}$ is set to zero so that the phase shift Δφ is controlled by the phase controller $R_φ$, so that the phase functional $F_φ$ becomes zero. The phase shift Δφ is then set in the excitation signal ES.

The frequency tuning according to the invention could also be combined with amplitude tuning, optionally also in combination with phase tuning. The idea behind the amplitude tuning is that the excitation amplitude R0 of the excitation signal ES is set to a maximum value. This maximum value depends on the implementation of the generating unit 3 for the excitation signal ES. For example, the amplitude R0 can be set to a value such that the full linearity range of an electronic circuit as generating unit 3 is used. This can be done, for example, with an amplitude controller $R_A$ that controls the excitation amplitude R0 to a predetermined setpoint.

This can be implemented with a resolver, for example, by using an amplitude functional $F_A = A_I^2 + B_I^2 + A_Q^2 + B_Q^2$. If the phase tuning described above is also used, the terms with the Q components disappear in the amplitude functional $F_A$. This amplitude functional $F_A$ is independent both of the position p and of the phase shift Δφ and, with the above definitions of the I and Q components, results in $$F_A = \frac{1}{4}R0 \cdot u.$$

An amplitude controller $R_A$ can now control the amplitude functional $F_A$ to a predetermined amplitude setpoint $F_{Aset}$. In this case, the amplitude setpoint $F_{Aset}$ can result from an implementation of the generating unit 3. The amplitude controller $R_A$ can be designed, for example, as a known I controller (integral controller).

Figure 6:
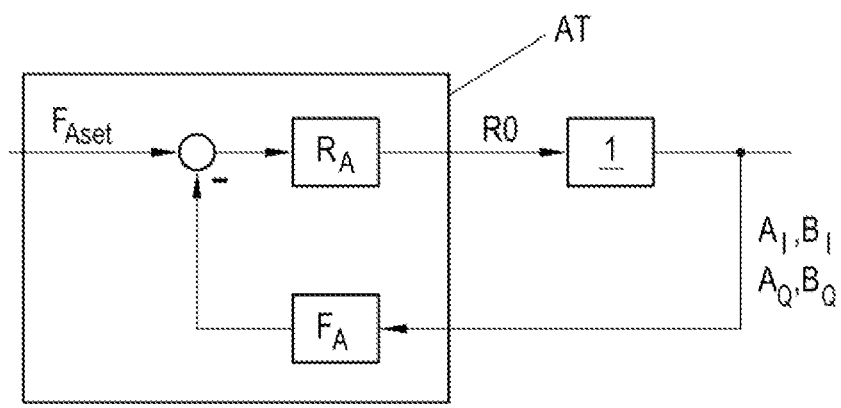
FIG. 6 shows amplitude tuning according to the invention.

The amplitude tuner AT can be implemented as shown in FIG. 6. The excitation amplitude R0 is then set in the excitation signal ES.

Figure 7:
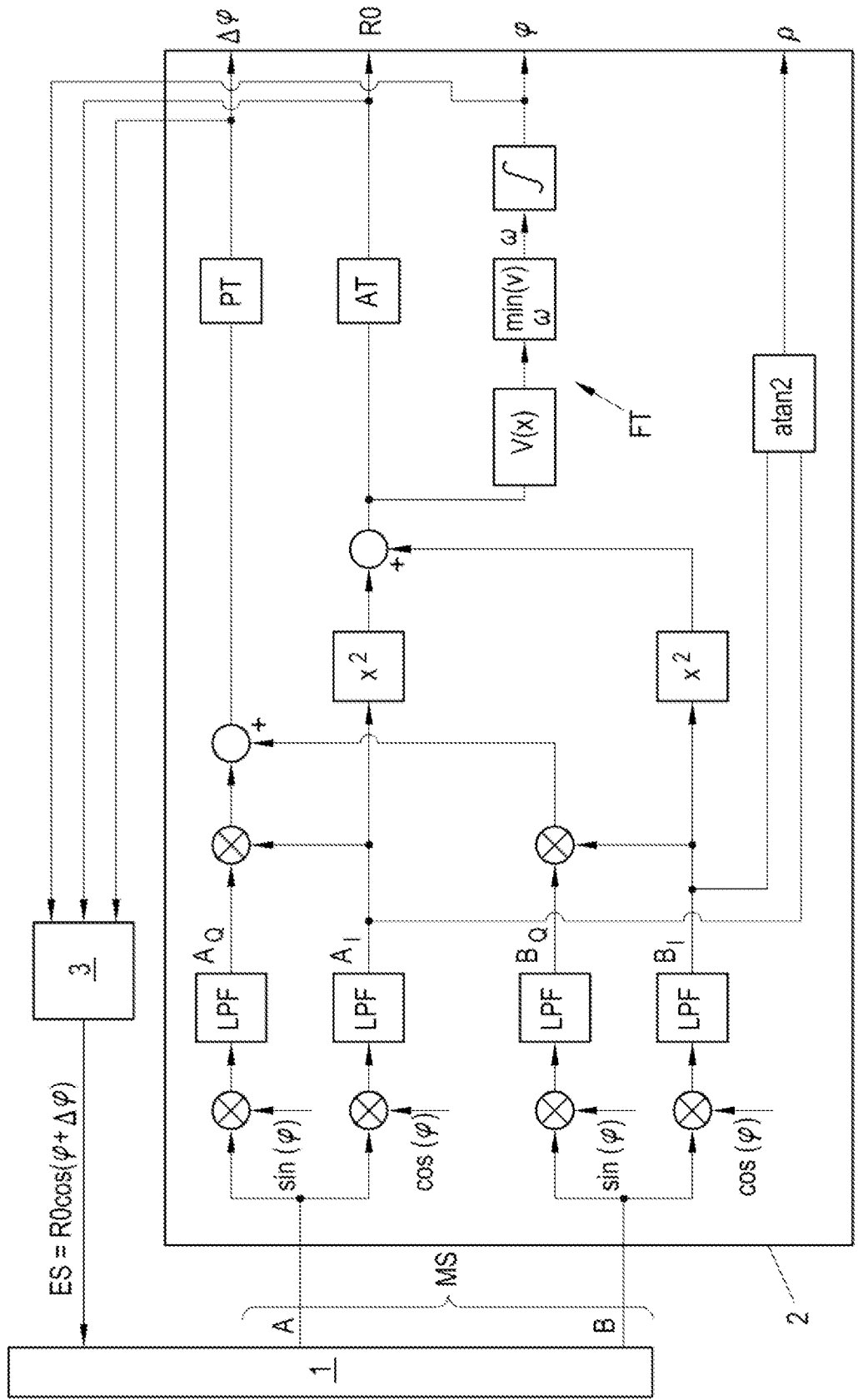
FIG. 7 shows an advantageous implementation of an evaluation unit with frequency tuning, phase tuning and amplitude tuning.

FIG. 7 shows an advantageous position determination with a resolver as an inductive position sensor 1. The resolver is excited with an excitation signal ES with an excitation frequency ω, a phase shift Δφ and an excitation amplitude R0. The measurement signal tracks A, B of the measurement signal MS output by the resolver are evaluated in an evaluation unit 2. The measurement signal tracks A, B are demodulated by means of an IQ method, and the I components $A_I$, $B_I$ as well as the Q components $A_Q$, $B_Q$ are determined. The frequency functional $F_f$, the phase functional $F_φ$ and the amplitude functional $F_A$ are determined from the I and Q components $A_I$, $B_I$, $A_Q$, $B_Q$. The excitation frequency ω is then set using a frequency tuner FT, in which the frequency tuning according to the invention described above is implemented. Likewise, the phase shift Δφ of the excitation signal ES is set using a phase tuner PT and the excitation amplitude R0 is set using an amplitude tuner AT.

Of course, the position P, in this case an angle ρ, can also be determined from the I components $A_I$, $B_I$ (or optionally from the Q components $A_Q$, $B_Q$), for example with the a tan 2 function.

The evaluation unit 2 is preferably implemented digitally, as software on microprocessor-based hardware. Alternatively, evaluation unit 2 can be physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. Further, the blocks and/or modules depicted in the figures can be formed by analog instrumentation, e.g., analog electric/electronic circuits, analog computers, analog devices, etc., and/or can be formed as application specific integrated circuits (ASICs) or other programmable integrated circuits, and, in the case of the blocks and/or modules, which can be implemented by microprocessors or similar, they may be programmed using software (e.g., microcode) to perform various functions discussed herein and may optionally be driven by firmware and/or software. Alternatively, each block and/or module may be implemented by dedicated hardware, or as a combination of dedicated hardware to perform some functions and a processor (e.g., one or more programmed microprocessors and associated circuitry) to perform other functions.

In a digital implementation, the measurement signal tracks A, B output by the position sensor 1 are converted from analog to digital using suitable analog/digital converters (ADC). Likewise, the excitation signal ES can be generated digitally and applied to the position sensor 1 by a digital/analog converter (DAC). The position value P can also be output in analog or digital form.

At least one memory (not shown). e.g., a non-transitory computer readable medium or media, can be provided to store one or more sets of instructions to perform any of the methods or computer-based functions disclosed herein, either alone or in combination with the other described devices. The at least one memory, accessible by the processors, can be part of the resolver or remote from the resolver, e.g., a remotely located server, memory, system, or communication network or in a cloud environment.

It is noted that the foregoing examples have been provided merely for the purpose of explanation and are in no way to be construed as limiting of the present invention. While the present invention has been described with reference to an exemplary embodiment, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein: rather, the present invention extends to all functionally equivalent structures, methods and uses, such as are within the scope of the appended claims.

What is claimed:

1. A method for determining a position of a moving part relative to a stationary part by an inductive position sensor, wherein an excitation winding is arranged on one of the moving part or the stationary part and at least one secondary winding is arranged on the other of the moving part or the stationary part, the method comprising:
   feeding an electrical excitation signal with an excitation frequency and an excitation amplitude into the excitation winding, which generates an electromagnetic excitation field;
   detecting a measurement signal induced in the secondary winding by the generated electromagnetic excitation field, wherein the measurement signal includes a superimposed noise signal, forming a frequency functional which is dependent on the excitation frequency and represents a measure of the superimposed noise signal, and changing the excitation frequency of the excitation signal so that the frequency functional representing the measure of superimposed noise signal is minimized or maximized and using the changed excitation frequency that minimizes or maximizes the frequency functional representing the measure of superimposed noise signal for the excitation signal, wherein the position of the moving part of the position sensor is determined from the measurement signal.

2. The method according to claim 1, wherein the frequency functional is used to examine an amplitude of the measurement signal with regard to a deviation from an expected signal curve of the measurement signal.

3. The method according to claim 1, wherein an amplitude information of the amplitude of the measurement signal is derived from the measurement signal and the frequency functional is a function of the amplitude information.

4. The method according to claim 3, wherein the measurement signal is demodulated in order to determine the amplitude information.

5. The method according to claim 3, wherein the measurement signal is demodulated with the excitation oscillation of the excitation signal in order to determine the amplitude information.

6. The method according to claim 5, wherein the measurement signal is demodulated with the excitation oscillation of the excitation signal in order to determine an I component of the measurement signal representing the amplitude.

7. The method according to claim 5, wherein the measurement signal is demodulated with a 90° out-of-phase excitation oscillation of the excitation signal, in order to determine a Q component of the measurement signal representing the phase.

8. The method according to claim 3, wherein a statistical variance of the amplitude information is used as the frequency functional.

9. The method according to claim 8, wherein the statistical variance is determined as an expected square deviation of a value of the amplitude information from an expected value of the amplitude information.

10. The method according to claim 6, wherein a phase shift of the excitation signal is set so that the I components of the measurement signal are at a maximum.

11. The method according to claim 1, wherein the excitation amplitude is regulated to a predetermined amplitude setpoint.

12. An evaluation unit for an inductive position sensor having a moving part with one of an excitation winding or at least one secondary winding and a stationary part having the other of the one of an excitation winding or at least one secondary winding, in which an electrical excitation signal with an excitation frequency and an excitation amplitude is fed into the excitation winding, which generates an electromagnetic excitation field that induces a measurement signal in the secondary winding which is fed to the evaluation unit with a superimposed noise signal on the measurement signal, the evaluation unit, which determines a position of the moving part relative to the stationary part of the position sensor from the measurement signal, comprises:

at least one memory and at least one processor configured to execute at least one set of instructions stored in the at least one memory to:

form a frequency functional, which is dependent on the excitation frequency and represents a measure of the superimposed noise signal, and determine the excitation frequency of the excitation signal which minimizes or maximizes the frequency functional representing the measure of the superimposed noise signal and use the excitation frequency which minimizes or maximizes the frequency functional representing the measure of the superimposed noise signal for the excitation signal.

13. The method according to claim 9, wherein an arithmetic mean of the amplitude information is used as the expected value.

* * * * *